United States Patent
Bhavnagarwala et al.

(10) Patent No.: US 6,876,595 B2
(45) Date of Patent: Apr. 5, 2005

(54) DECODE PATH GATED LOW ACTIVE POWER SRAM

(75) Inventors: Azeez Bhavnagarwala, Newton, CT (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/455,601

(22) Filed: Jun. 5, 2003

(65) Prior Publication Data

US 2004/0246812 A1 Dec. 9, 2004

(51) Int. Cl.[7] ............................................... G11C 8/00
(52) U.S. Cl. ................... 365/230.06; 365/233; 365/239
(58) Field of Search .......................... 365/230.06, 233, 365/239, 230.03

(56) References Cited

U.S. PATENT DOCUMENTS

| | | | |
|---|---|---|---|
| 5,936,977 A | * | 8/1999 | Churchill et al. ............. 714/26 |
| 6,069,839 A | * | 5/2000 | Pancholy et al. ............. 365/233 |
| 6,151,266 A | * | 11/2000 | Henkels et al. ........ 365/230.06 |

* cited by examiner

Primary Examiner—Son T. Dinh
(74) Attorney, Agent, or Firm—Robert M. Trepp; F. Chau & Associates, LLC

(57) ABSTRACT

Circuits and methods for controlling data access operations in memory devices such as SRAM (static random access memory) devices. The circuits and methods provide timing and control for memory access operations by propagating a control pulse along a decode path from which a sequence of control pulses are generated at points in the decode path to synchronize activation of wordlines and sense amplifiers and precharge/equalization of bit lines. Preferably, an address gated pulse schema is implemented to synchronize and restrict switching activity spatially and temporally to only regions of a memory array that are being accessed, and for limited periods of time just sufficient to generate signals for read or write operations. Advantageously, the circuits and methods enable SRAM cell delays to track CMOS gate delays more closely at low voltages and reduce switching power by restricting switching transitions only to the regions of memory that are accessed.

36 Claims, 4 Drawing Sheets

DECODE PATH GATED LOW ACTIVE POWER SRAM

TECHNICAL FIELD OF THE INVENTION

The present invention relates generally circuits and methods for controlling data access operations in SRAM (static random access memory) devices. More specifically, the present invention relates to circuits and methods for controlling memory access operations by propagating a control pulse along a decode path from which a sequence of control pulses are generated at points in the decode path to synchronize activation of wordlines and sense amplifiers and precharge/equalization of bit lines.

BACKGROUND

As SOCs (system-on-a-chip) become more highly integrated with millions of devices being packed into a single SOC, power consumption is a critical design consideration due to the increasing gap between the energy required by portable computation/communication devices and the energy supplied by the battery. Traditionally, in a CMOS device, power consumption is caused primarily from the switching of logic states. In particular, the switching power is expressed as:

$$P_{switch} = \alpha_{0 \to 1} f_{CLK} (C_{load} V_{dd}^2)$$

where $\alpha_{0 \to 1}$ is the average number of times in a clock cycle that a switch from a logic level "0" to "1" occurs, $f_{CLK}$ is the clock frequency, $C_{load}$ is the load capacitance and where $V_{dd}$ is the supply voltage. The equation clearly shows the supply voltage affects power dissipation in a quadratic order.

Single-cycle SRAM caches that are employed for fast, low cost wireless DSP applications (such as 3G cell phones) impose stringent design constraints on active power. With increases in the spread of Vt (threshold voltage) fluctuations that exist in cell and sense amplifier transistors, delay variability of the bit path increases dramatically at low operating voltages, requiring larger margins for evaluate periods of the SRAM cell and sense amplifiers. As a result, the bitpath power increases, which dominates SRAM active power.

In a conventional SRAM, control pulses are driven across a memory array to implement specific functions such as precharging/equalizing bitlines or enabling sense amplifiers and write buffers. Typically, these control pulses are gated-off by block select signals coming off a decode network that identify a specific set of memory blocks from which data is being read, or to which data is being written. This conventional method is disadvantageous in that skew is developed between edges of the control pulses that enable the wordline (WL) (coming from the decode network) and the pulses that precharge/equalize bitlines and that enable sense amplifiers and write buffers. Consequently, such skew requires generation of control pulses have larger pulse widths, to thereby develop more signal to accommodate process, random and environment variations. However, larger pulse widths directly results in higher active power and lower performance.

Various techniques to match the clock path with the bitpath using dummy bit lines BLs to minimize skew have been proposed, but such techniques do not address the random sources of variation such as dopant fluctuations or line edge roughness (LER) from which the skew between pulses along the clock and bitpath become significant. In addition, these techniques not only require significantly more design effort, but only address the skew development between the WL and the sense amplifier enabling edges.

Therefore, it would be highly desirable to develop circuits and methods for controlling memory access operations in a CMOS-based SRAM, for example, which would enable efficient synchronization between control pulses for controlling read/write circuitry, while minimizing the power dissipation associated with such control.

SUMMARY OF THE INVENTION

The present invention is directed to circuits and methods for controlling data access operations in memory devices such as SRAM devices. More specifically, circuits and methods according to embodiments of the invention provide timing and control for memory access operations by propagating a control pulse along a decode path from which a sequence of control pulses are generated at points in the decode path to synchronize activation of wordlines and sense amplifiers and precharge/equalization of bit lines.

Preferably, an address gated pulse schema is implemented to synchronize and restrict switching activity spatially and temporally to only regions of a memory array that are being accessed, and for limited periods of time just sufficient to generate signals for read or write operations. Advantageously, circuits and methods according to the present invention enable SRAM cell delays to track CMOS gate delays more closely at low voltages and reduce switching power by restricting switching transitions only to the regions of memory being accessed.

In one embodiment of the invention, a method for controlling data access operations in a memory device comprises generating a control pulse in a decode network of a memory array, and propagating the control pulse along a decode path of the decode network to synchronize sequential activation of control circuitry along the decode path for enabling a data access operation in a selected memory block of the memory array.

Preferably, the control pulse is propagated along a single decode path from a single address bit input buffer of the least significant bit of the address signal, to a selected wordline of the selected memory block. The control pulse is generated from a system clock signal when an active command is received for the data access operation. As the control pulse propagates along a decode path, one or more psuedo-control pulses are sequentially generated to synchronize switching functions in the decode path.

In another embodiment a method is provided for controlling data access operations in a SRAM (static random access) device comprising a hierarchical memory array, wherein the memory array is divided into a plurality of memory blocks, wherein each memory block is divided into a plurality of global columns, and wherein each global column is divided into a plurality of local blocks. The method comprises: inputting an address signal to a decode network of a memory block of the memory array; sampling a least significant bit of the address signal to generate a control pulse; propagating the control pulse along a decode path from the input of the least significant bit to a global column decoder in the decode network; inputting a global column select signal to the global column decoder for selecting a global column corresponding to the global column decoder and sampling the input global column select signal using the first control pulse to output a second control pulse from the global column decoder; and propagating the second control pulse along a decode path of the selected global column to synchronize sequential activation of control circuitry of the selected global column for enabling a data access operation in a selected local block of the selected global column.

Preferably, the second control pulse is used to either generate a wordline enable pulse that is synchronized to a write enable pulse to perform a write operation in the selected local block, or to generate a wordline enable pulse that is synchronized to a sense amplifier enable pulse to perform a read operation in the selected local block.

In yet another embodiment, a semiconductor device comprises a memory array that is logically divided into a plurality of memory blocks, a decode network for receiving an address signal and decoding the address signal to select a memory block in the memory array to perform a data access operation, and a pulse generator for generating a control pulse that propagates along a decode path of the decode network to synchronize sequential activation of control circuitry in the decode path for enabling the data access operation in the selected memory block. The control pulse propagates along a single decode path from a single address bit input buffer, to a selected wordline of the selected memory block. The decode network comprises control circuitry for sequentially generating one or more psuedo-control pulses to synchronize switching functions in the decode path.

In one embodiment, the memory array is a SRAM (static random access memory) such as a synchronous SRAM. In another embodiment, the memory array comprises a cache memory, wherein the cache memory comprises an instruction cache or a data cache.

These and other embodiments, aspects, features, and advantages of the present invention will become apparent from the following detailed description of the preferred embodiments, which is to be read in connection with the accompanying drawings.

DETAILED DESCRIPTION OF PREFERRED EMBODIMENTS

Preferred embodiments of the present invention will be described hereinbelow with reference to the accompanying drawings. In the following description, a detailed description of well-known memory functions and architectures will not be provided to avoid obscuring the invention in unnecessary detail.

The present invention is directed to circuits and methods that provide timing and control for memory access operations in memory devices such as SRAM devices, for example, by propagating a control pulse along a decode path from which a sequence of control pulses are generated at points in the decode path to synchronize activation of wordlines and sense amplifiers and precharge/equalization of bit lines. Advantageously, circuits and methods according to the present invention enable a dramatic reduction in the switching power dissipation of conventional synchronous (clocked) SRAM arrays without incurring the performance penalties that arise from eliminating the clock distribution network in an SRAM array.

Further, circuits and methods according to embodiments of the invention provide a significant decrease in the adverse affects that operating conditions, such as variability of processes, supply voltage Vdd, and temperature changes across the dimensions of the memory array, have on maintaining synchronization for a sequence of enabling pulses that are used to drive the requested data along a bit path of an SRAM. Consequently, smaller design margins on pulse widths can be implemented in accordance with the present invention, as compared to those margins required for conventional synchronous SRAMs, which provides reduced power consumption. Indeed, unlike conventional CMOS circuits where switching power dissipation increases as the square of supply voltage (as noted above), circuits and methods according to the present invention limit increases in SRAM power dissipated along the bit-path to a sub-quadratic dependence on supply voltage.

Figure 1A:
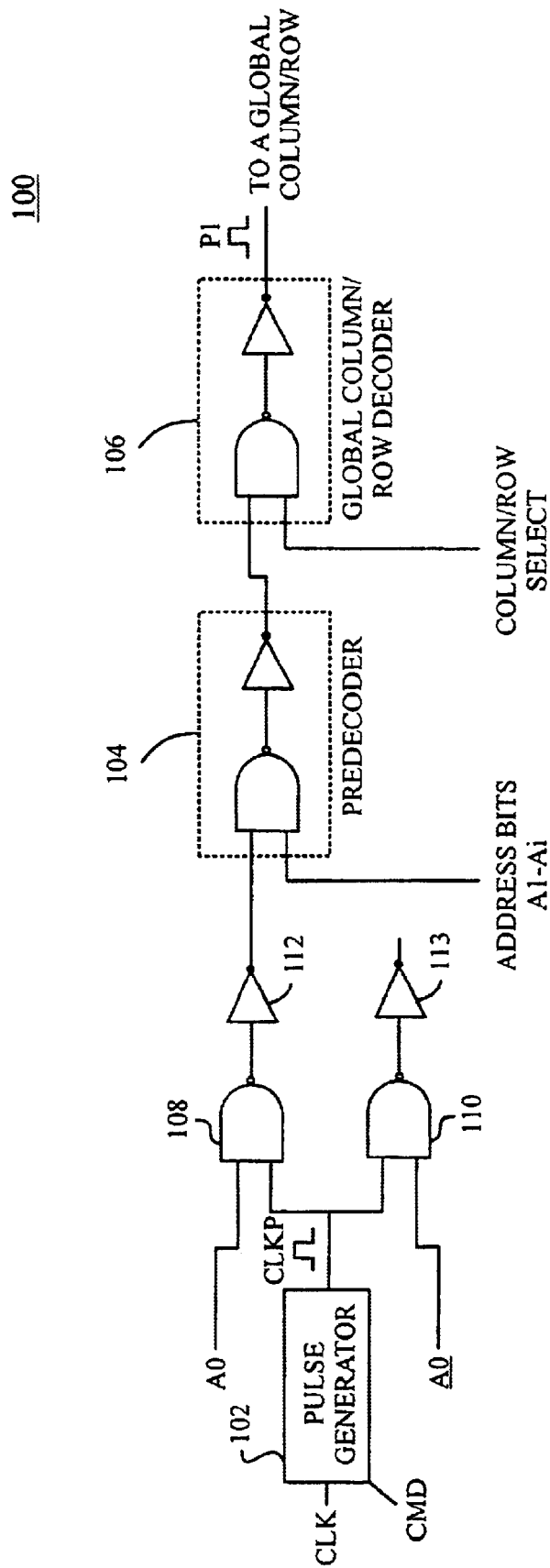
FIGS. 1A and 1B schematically illustrate a decode circuit according to an exemplary embodiment of the present invention, which implements an address gated pulse operation to generate a pulse that propagates down a decode path to provide synchronization of data access operations in a memory device.
Figure 1B:
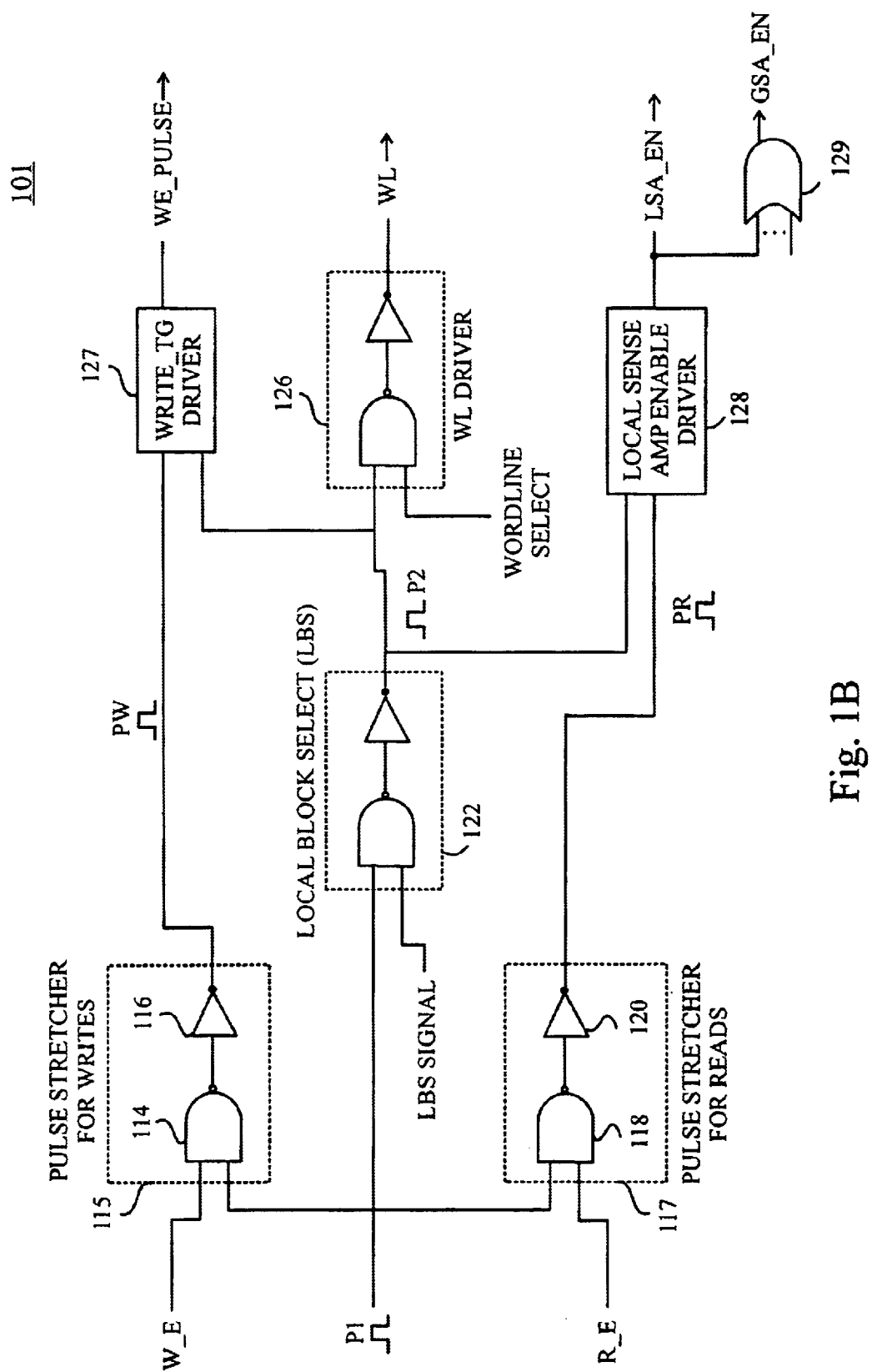

In general, FIGS. 1a and 1b schematically illustrate a decoding circuit according to an embodiment of the present invention, which implements an address gated pulse operation to generate a pulse that propagates down a decode path to provide synchronization and of data access operations in a memory device. In particular, FIG. 1A schematically illustrates a portion of a decoding circuit according to an embodiment of the present invention for generating a pulse signal using a least significant address bit and propagating the pulse signal to a global column (or global row). Further, FIG. 1B schematically illustrates a decoding circuit according to an embodiment of the present invention, which is implemented for a global column (or global row) for processing a pulse signal (received from the decode circuit of FIG. 1A) to synchronize data access operations.

In the exemplary embodiments of the invention as described herein, for purposes of illustration, it is assumed that the circuit of FIGS. 1a and 1b are implemented in a synchronous SRAM (e.g., synchronous CMOS-based SRAM) having a hierarchical array architecture in which the memory array is divided into a plurality of blocks (or macros), wherein each block (macro) is divided into a plurality of global columns (or global rows), and wherein each global column (or global row) is divided into a plurality of local subarrays (or local blocks).

Figure 3:
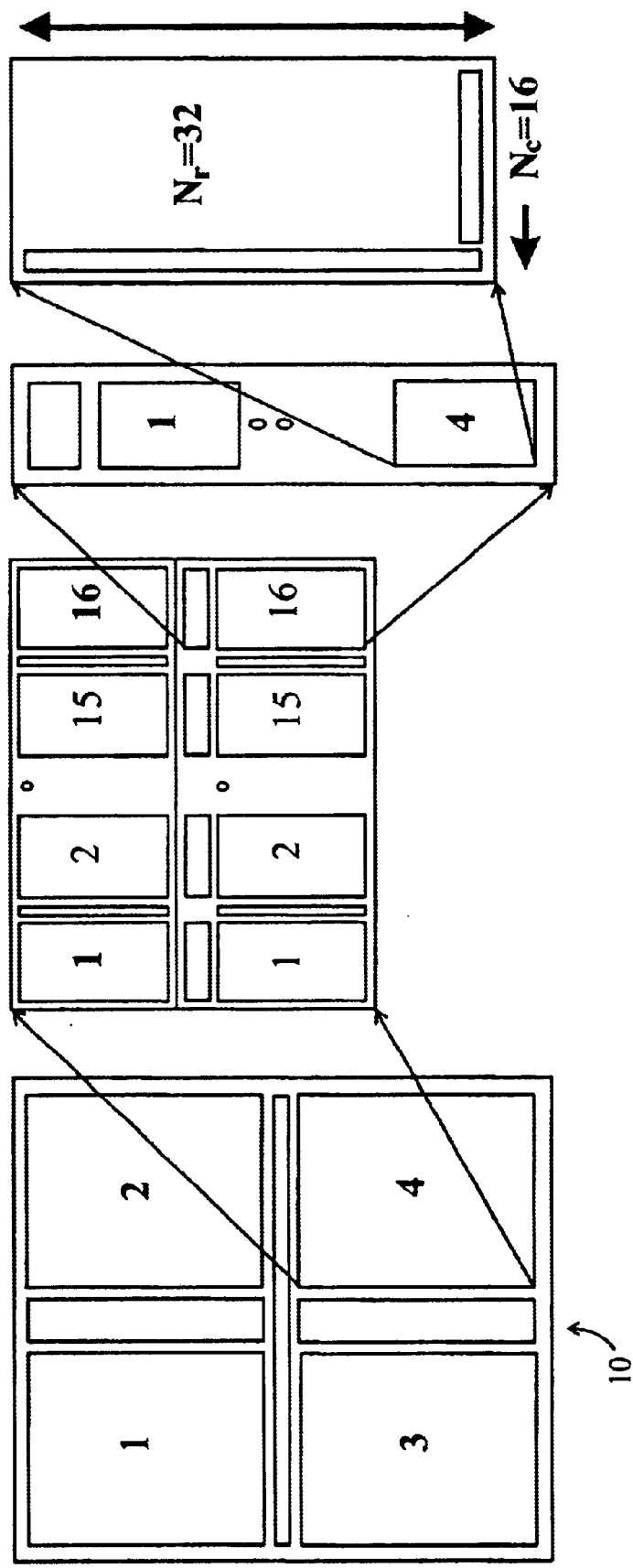
FIG. 3 schematically illustrates an exemplary hierarchical memory framework in which circuits and methods of the present invention may be implemented.

For example, FIG. 3 schematically illustrates a hierarchical memory that may be implemented with the circuits and methods of the invention as described herein. In FIG. 3, an SRAM memory array (10) is shown logically divided into four blocks (1–4) (macros). Further, each block is logically divided into two halves, wherein each half comprises sixteen global columns (1–16). Each global column is further logically divided into four local arrays (or local blocks), wherein each local block is shown to be 16 bits wide (i.e., number of columns $N_c$=16) and 32 bits high (i.e., number of rows (or wordlines) is $N_r$=32). Thus, in the exemplary embodiment of FIG. 3, each global column comprises 16×128 bits (memory cells).

Moreover, in the memory array framework of FIG. 3, each macro (block) comprises local sense amplifier circuits and local bitline precharge/equalization circuits connected to local bit line pairs of local blocks. In addition, global sense amplifier circuits and a global bitline precharge/equalization circuits are connected to global bitline pairs of the global columns. The global bitline pairs are connected to the outputs of the local sense amplifiers. In addition, the memory array (10) of FIG. 3 comprises one or more global row decoders that decode address signals to select local wordlines (rows) of local column blocks to perform data access operations in selected local blocks.

It is to be understood that the exemplary memory architectures described herein are for illustrative purposes and should not be construed as placing any limitation on the scope of the invention. Indeed, those of ordinary skill in the art can readily envision other memory frameworks in which the present invention may be implemented.

FIG. 1A schematically illustrates a decoding circuit (100) according to an embodiment of the present invention for generating a pulse signal using a least significant address bit and propagating the pulse signal to a global column (or global row). In a preferred embodiment, the decoding circuit (100) is, in general, an extension of a conventional predecoding circuit that decodes address signals (A0 . . . Ai) for selecting one of a plurality of global columns (or global rows) within a block of memory. In accordance with the present invention, however, the decode circuit (100) of FIG. 1A comprises a pulse generator (102) that generates a short pulse (CLKP) (e.g., 4–6 gate delays) off the rising edge of a clock signal (CLK) in response to an active command signal (CMD). The CMD signal is generated by some source (not shown) to indicate a data access operation (read or write). In a preferred embodiment, the pulse (CLKP) is transmitted down a decode path starting at the least significant address bit (Ao) to synchronize the timing operations of circuits that enable a data access operation. As explained in detail hereafter, the pulse propagates only through a decode path defined by the address bits, wherein the decode path serves as a "clock" path from which a sequence of pulses are generated to precharge and evaluate the bitpath in a selected global column, for example.

It is to be understood that FIG. 1A illustrates only a relevant portion of a decoding circuit (100) (which decodes address bits and selects a global column/row of a memory block) for purposes of explaining the decoding path in which the synchronizing pulse is generated. In other words, FIG. 1A does not show the entire fan-out/fan-in of the predecoders/decoder in the decoding circuit.

In the exemplary embodiment of FIG. 1A, an address bit (A0) and pulse (CLKP) are input to a NAND gate (108) and the output of the NAND gate (108) is input to an inverter (112). The NAND gate (108) and inverter (112) effectively perform an "AND" operation on the address bit (A0) and the pulse (CLKP), such that the least significant address bit (A0) is sampled by the pulse (CLKP) at the output of inverter (112). Furthermore, an address bit (/A0) (the complement of bit A0) and pulse (CLKP) are input to a NAND gate (110) and the output of the NAND gate (110) is input to an inverter (113). The NAND gate (110) and inverter (113) effectively perform an "AND" operation on the address bit (/A0) and the pulse (CLKP), such that the least significant address bit (/A0) is sampled by the pulse (CLKP) at the output of inverter (113).

All of the address bits (A0–Ai) drive a plurality of predecoders (104) such that any combination of address bits drive the output of one predecoder. Although not specifically shown in FIG. 1A, for example, the address bit Ao drives 2 predecoders (104), which are connected to the output of inverter (112) and address bit (/A0) drives two predecoders (104), which are connected to output of the inverter (113).

Each predecoder (104) (for the least significant address bits) receives another address bit (A1 . . . or Ai). The pulse CLKP) will propagates only through a decode path enabled by other address bits (A1–Ai) through a predecoder (104).

Recognizing that there is substantial spatial locality in the requests for data from a processor to either the instruction cache or to a data cache, the least significant address bits have the highest activity factors. As such, the predecoders (104) that accept the least significant bits will be selected to be pulsed as above enabling the dynamic power dissipation to be mostly limited to the path traversed by this pulse. In the circuit of FIG. 1A, since only one of several address bits is sampled by the CLKP pulse, the total dynamic power dissipated in the decode network is limited to the dissipations along this one path from the one address input buffer (not shown) to a selected WL (wordline).

The output of the predecoder(s) (104) for the least significant address bit (A0, /A0) drive a plurality of global column (or global row) decoders (106). Although only one global column (or row) decoder (106) is shown in FIG. 1A, it is to be understood that there is one global column (or global row) decoder circuit (106) for each global column (or global row) of a selected a memory block and only one decoder (106) is activated at a given time. Actually, a plurality of global column/row decoders (106) receive as input the pulse signal output from one of the activated predecoders (104) associated with the least significant bits (A0, /A0).

In addition, a global column select signal (or a global row select signal), which is a static control signal generated by other predecoding circuitry (not shown) using address bits (other than Ao . . . Ai), is input to the global column/row decoder (106) corresponding to a selected global column/row. A static global column/row select signal (having a high logic level) is sampled by the pulse output for the selected predecoder (104) to output a pulse P1 to the selected global column/row. Again, it is to be understood that only one subdecoder (104) and column/row decoder (106) is shown in FIG. 1A for purposes of illustration. It is to be understood, however, that the decode network (100) of FIG. 1A comprises an architecture, and implements an addressing scheme, that always outputs a pulse from a subdecoder (104) associated with the least significant address bit (Ao), to a selected global column/row decoder (106), to thereby sample the column/row select signal (associated with a selected global column/row) and propagate a control pulse P1 to the selected global column/row.

FIG. 1B schematically illustrates a decoding circuit according to an embodiment of the present invention, which is implemented for each global column (or global row). More specifically, FIG. 1B illustrates the control and timing circuitry (101) for processing the pulse signal P1 (output by the decoder (106) in FIG. 1B) to synchronize data access operations for the selected global column (or global row).

In general, FIG. 1B illustrates a decode path that serves as a 'clock path' from which a sequence of pulses P2, PW, PR are generated for precharging and evaluating the bitpath in the selected global column/row. The circuit (101) comprises a pulse stretcher circuit (115) having a NAND gate (114) and inverter (116). The pulse stretcher circuit (115) operates to sample a write enable signal W_E with the pulse P1 to generate a write pulse signal PW, as well as widen (or stretch) the pulse P1 such that the resulting write pulse PW is wider than P1. Likewise, a pulse stretcher circuit (117) comprises a NAND gate (118) and inverter (120), which operates to sample a read enable signal R_E with the pulse P1 and generate a read pulse signal PR, as well as widen (or stretch) the pulse P1 such that the resulting read pulse signal PR is wider than pulse P1.

The read/write enable control signals, R_E and W_E, respectively, are static signals that are sampled by the pulse P1, depending on whether a read or write command has been received. The NAND gates (114, 118) of the respective pulse stretcher circuits (115, 117) effectively stretch the pulse P1 by tying to Vdd or Gnd the gates of long channel NFETs or PFETs that comprises the NAND gates (114, 118).

The decoding circuit (101) further comprises a local block select (LBS) circuit (122) which generates a pulse P2 that drives a corresponding wordline driver (126), a write transmission gate driver (127) and local sense amplifier enable driver (128). The LBS circuit (122) comprises a NAND gate and inverter, which effectively sample a static LBS control signal using the pulse P1 to generate pulse P2. Furthermore, the WL driver (126) comprises a NAND gate and inverter which effectively sample a static wordline select control signal using the pulse P2 to generate a wordline enable signal WL.

It is to be understood that although only one LBS circuit (122) is shown, the decoding circuit (101) comprises a plurality of LBS circuits (122), one for each local memory block within the global column/row, and each LBS circuit (122) receives as input the pulse P1. The LBS control signal is generated by control circuitry (not shown) and input to a LBS circuit (122) corresponding to a selected local memory block associated with the global column/row. Thus, in effect, the LBS signal guides the pulse P1 to the selected local memory block control circuitry.

Furthermore, although only one WL driver (126) is shown, it is to be understood that there are a plurality of WL drivers (126) connected to the output of each LBS circuit (122). In other words, the pulse P2 generated by a LBS circuit (122), which is enabled by the LBS control signal, is input to a plurality of WL drivers (126) associated with the selected local block. The wordline select control signal is generated by control circuitry (not shown) and input to a WL driver circuit (126) corresponding to a selected wordline within a selected local memory block of the selected global column/row. Thus, in effect, the wordline select control signal guides the pulse P2 to the selected wordline (WL).

There is one write transmission gate driver (127) for each local block of memory of the global column/row. The write_TG driver (127) generates a write enable pulse signal, WE_PULSE, in response to the synchronized PW and P2 signals, to activate a write transmission gate circuit (not shown). The write transmission gate circuit comprises a plurality of transmission gates that are responsive to the WE_PULSE signal to connect global write bitlines (global data line) to the local bitline pairs of the local block of memory during a write operation, such that when the selected wordline is activated via the WL signal, the data is written to the corresponding cells of the activated wordline. The decoding and timing circuitry in FIG. 1B enables synchronization (overlapping) between WL and WE_PUSLE so that data can be written efficiently. Preferably, the WE_PUSLE is wider than the WL pulse to account for any variation that may exist between the edges of the WE_PULSE and WL pulses.

Furthermore, there is one local sense amplifier enable driver (128) for each local block of memory. When a read operation is to be performed, the local sense amplifier enable driver (128) receives synchronized pulses P2 and PR and generates a control signal, LSA_EN, to enable local sense amplifiers. In addition, the output of the local sense amplifier enable driver (128) drives an OR gate (129), wherein the inputs to the OR gate (129) are the outputs of each local sense amplifier enable driver for each local block associated with the global column/row. Therefore, if any of the local blocks of memory are selected in the given global column/row, the LSA_EN signal generated by the associated local sense amplifier enable driver will drive the OR gate (129). The output of the OR gate (129) is a global sense amplifier enable signal, GSA_EN, which activates global sense amplifiers at a given delay time after the WL is activated.

The expanded PW and PR pulses, which are driven by the inverters (116) and (120), respectively, are used for gating a data I/O bus to the selected global column. These expanded pulse provide ample margin to enable the local write TG driver (127) or local sense amplifiers driver (128) when the pulses PW and PR are synchronized with (overlap, intersect) the shorter pulse, P2, off the clock path that selects a subarray, e.g., a local block select (122), within the selected global column.

Figure 2:
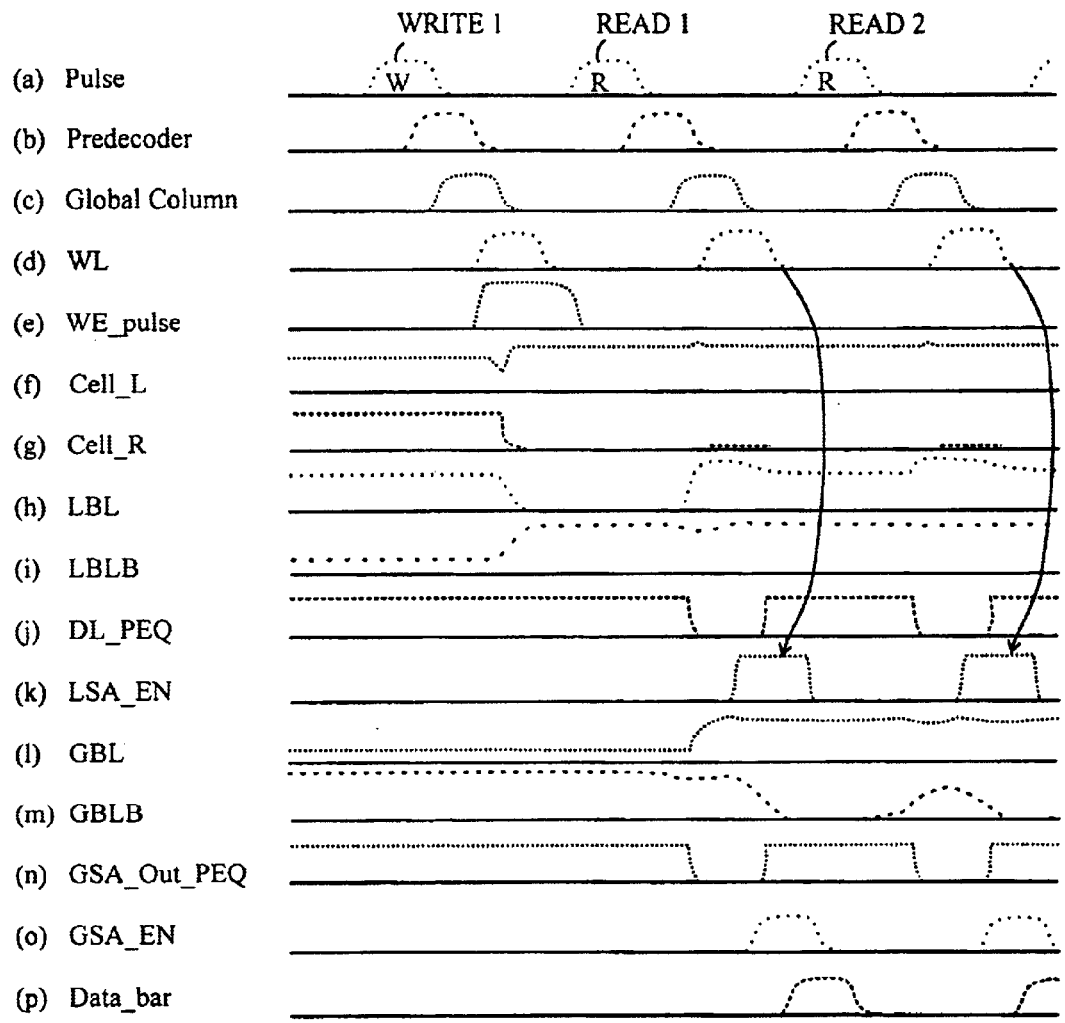
FIG. 2 is an exemplary timing diagram illustrating modes of operation of the exemplary decode circuits of FIGS. 1a and 1b.

Exemplary modes of operation of the decoding circuits of FIGS. 1a and 1b will be explained in further detail with reference to the timing diagram of FIG. 2. In FIG. 2, for illustrative purposes, it is assumed that one write operation and two read operations are performed for the same memory location associated with the same wordline in the same local block of memory. FIG. 2 illustrates the timing of a plurality of signals (a)–(p) for such read and write operations, including synchronizing pulses that are generated along the decode paths of the circuits (100) and (101) shown in FIGS. 1a and 1b.

For example, signal (a) represents a plurality of CLKP pulses that are generated by the pulse generator (102) (FIG. 1A) in response to write and read commands. Signal (b) represents pulse signals output from a predecoder (104) associated with the least significant address bits (FIG. 1A) in response to the CLKP pulses of signal (a). Signal (c) represents global column pulses (P1) output from a decoder (106) (FIG. 1A) in response to the pulses of signal (b). Signal (d) represents a wordline enable signal (WL) that is generated at the output of a wordline driver (126) (FIG. 1B). Signal (e) represents a WE_PULSE signal output from the write driver (127) (FIG. 1B), resulting from a write command (associated with "Write1" pulse, signal (a)). Signals (f) and (g) represent signals of the storage nodes, Cell_L and Cell_R, of the accessed memory cell. Signals (h) and (i) represent the local bit line pair (LBL) and (LBLB) of the memory cell. Signal (j) represents a precharge enable signal, DL_PEQ, for a global bitline. Signal (k) represents the enable signal, LSA_EN, output from the local sense amplifier enable driver (128) (FIG. 1B). Signals (l) and (m) respectively represent a global bit line pair (GBL) and (GBLB). Signal (n) represents a global sense amplifier precharge and equalization signal, GSA_out_PEQ. Signal (o) is the global sense amplifier enable signal, GSA_EN, which is output from the OR gate (129)(FIG. 1B). Signal (p) represents the complement of the data bit, Data_bar, that is read from the memory cell.

In general, as shown in FIG. 2, decoding circuits and methods according to the present invention allow the wordline enable signal WL to be synchronized with the control pulses that are output from the circuits that enable the write and read operations. Advantageously, the decoding network (comprising FIGS. 1a and 1b, for example) only propagates the synchronizing pulse (CLKP) along a decode path down to regions where data is actually being accessed such that as the pulse propagates closer to the data being accessed, other pulses (P1, PW, PR, P2, for example) are generated to synchronize the data access operation (read or write) for the memory location selected by the wordline enable WL pulse.

For a write operation, is preferable to enable the WE_PUSLE at the same time that the WL signal is enabled (i.e., the WL is activated), so that data can be accurately written to the bitlines. For instance, as shown in FIG. 2, the WE_PULSE signal is synchronized (overlapped) with the WL enable signal with enough margin that a write operation will be performed if the WE_PUSLE is delayed or advanced in time with respect to the WL signal. In accordance with the invention, however, since the WE_PULSE and WL signal are generated by a common source (P2), delay or advances in timing will effectively be tracked in both signals. The WE_PULSE enables the data to be sent from a global data line to the local bit lines. Next, with respect to the cell storage node signals (f) and (g), the CeLL_R signal is shown to decrease to 0 voltage (and the Cell_L signal is driven to logic "high") within about ⅓ of the time that the WL signal is enabled, which means that a "0" is being written to Cell_R of the memory cell. As further shown in FIG. 2, at the same time, the LBL signal is transitioning to logic "0", and the LBLB signal is transitioning from an intermediate state (which exists before WE_PULSE is enabled) to a logic "high" voltage (e.g., Vdd), and the cell storage nodes are swinging correspondingly.

Next, with respect to the first read operation (READ 1) for the same memory cell, an LSA_EN signal is generated in response to the synchronized P2 and PR pulses (FIG. 1B). Note that a WE_PULSE is not generated for the read operation. The timing and decoding circuits of FIGS. 1a and 1b ensure that the LSA_EN signal is synchronized (overlapped) with the wordline enable signal WL to provide an efficient read operation. Indeed, if the LSA_EN signal is generated to early (with respect to WL activation), the data will not be read from the memory cell, and if the LSA_EN is too delayed (with respect to WL activation), the memory will operate slower, dissipate more power, and the global sense amplifier will not read accurately. As shown in FIG. 2, the LSA_EN signal is generated at some time delay after the WL signal is enabled, which causes the sense amplifiers to be activated with such delay after the WL is activated. This is because there has to be sufficient differential voltage on the bitlines before the sense amplifier can sense and amplify the correct bit value. For example, as shown in FIG. 2, where is some differential voltage on the local bitlines LBL and LBLB before the LSA_EN signal is enabled. The differential voltage of the local bit line pair is amplified and sent to the global bit line pair GBL and GBLB, where as shown, the differential voltage of the global bit line pair is larger than the differential voltage of the local bit line pair. Therefore, there is preferably a delay of about a few gate delays for generating the LSA_EN signal after the WL signal is generated.

For a read operation, the output of the sense amplifier (which is the data read from the cell) is sent to an inverter which generates the Data_bar output signal. In other words, Data_bar represents the complement of the data read from the memory cell.

The GSA_EN is a control pulse for enabling the global sense amplifier and is essentially a marginally delayed version of the LSA_EN signal. The output of the local sense amplifier, which is GBL and GBLB, is input to the global sense amplifier. The global sense amplifier begins sensing the inputs (GBL and GBLB) in response to the global sense amplifier enable signal, GSA_EN.

Therefore, as described above, circuits and methods according to the present invention enable efficient control of the timing of the sequence of circuits that are activated for performing data access operation. Such control is obtained by propagating a pulse along a decode network path to thereby synchronize the precharge/equalize control pulses with the control pulses that enable the wordlines and sense amplifiers. The propagating pulse, which preferably emanates from a single address-input buffer (preferably the least significant address bit) towards a selected WL, provides the necessary pseudo-clock pulses within the bit path of an accessed local block to synchronize the switching activity of the control circuits in the bit path.

It is to be appreciated that there are many advantages associated with the present invention. One advantage is that, since the area of a local block is much smaller than the area of the entire array (typically ¹⁄₆₄–¹⁄₅₁₂) the spatial variations due to process and temperature variations are, to a first approximation, the same for all signals within the selected local block. As such, skews of the control signal are primarily determined only by random variations such as those due to random placement of dopant atoms. More specifically, since control pulses are generated from common sources, any variations in one control pulse will exist in another control pulse generated by a common source, which maintains the timing and synchronization provided by the control pulses. For example, as shown in FIG. 1B, the control pulse P2 is commonly used to generate the WE_PULSE, WL, and LSA_EN signals. As such, any variations or noise that affects WL will be reflected in WE_PULSE and LSA_EN because the signals have a common source P2. As such, the WL signal and the LSA_EN signal, for example, will track each other to maintain synchronization/timing between the signals. Furthermore, since the activation of the local sense amplifier (via LSA_EN) is synchronized with the activation of the global sense amplifier (via GSA_EN), as explained above, variations in P2 will be propagated down to GSA_EN, which is generated by LSA_EN, such that if WL is delayed, the same affect will be reflected in GSA_EN.

Another advantage of the present invention is that by propagating a control pulse along the decode network path to time the activation of the circuits that enable a memory access, the skews between pulses are much less than skews that occurs in a conventional approach where the paths traversed by pulses to precharge bitlines or enable sense amplifiers, for example, are independent of the decode path. In other words, by using the same decode network to generate the control pulses that are only a few gates apart, synchronization can be effectively maintained because there is insignificant dispersion of the signals. For instance, as shown in FIG. 1B, the WL pulse is only 4 gate delays away from P1. The effects of dispersion are further minimized by the fact that control pulses are generated from a common source (e.g., WL and WE_PULSE are generated from P2). As a result, since the present invention allows synchronization of the control pulses to be accurately maintained, the present invention enables control pulse widths to be made much smaller with the primary benefit of decreasing active power. Also, since the pulses for timing the bitpath are generated in the decode network itself, switching activity will occur only in those regions of the array that are accessed, which further results in reduction of active power.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for controlling data access operations in a memory device, comprising the steps of:
   generating a control pulse in a decode network of a memory array; and
   propagating said control pulse along a decode path of said decode network to synchronize sequential activation of control circuitry along said decode path for enabling a data access operation in a selected memory block of said memory array.

2. The method of claim 1, wherein the step of generating said control pulse comprises generating a control pulse from a system clock signal when an active command is received for the data access operation.

3. The method of claim 1, wherein the step of propagating said control pulse along a decode path of said decode network comprises propagating said control pulse along a single decode path from a single address bit input buffer, to a selected wordline of said selected memory block.

4. The method of claim 1, wherein the step of propagating said control pulse along a decode path comprises sequentially generating one or more psuedo-control pulses to synchronize switching functions in said decode path.

5. The method of claim 4, wherein the step of generating a psuedo-control pulse comprises sampling an address signal using said control pulse to generate a first control pulse.

6. The method of claim 5, wherein the step of sampling an address signal comprises sampling a least significant address bit.

7. The method of claim 5, further comprising the step of propagating said first control pulse along a path associated with said address signal in an address predecoding network.

8. The method of claim 5, further comprising the step of sampling a global column/row select signal using said first control pulse to generate a second control pulse that is propagated to a global column/row decoding network.

9. The method of claim 8, further comprising the step of using said second control pulse to either (i) generate a wordline enable pulse that is synchronized to a write enable pulse to perform a write operation, or to (ii) generate a wordline enable pulse that is synchronized to a sense amplifier enable pulse to perform a read operation.

10. The method of claim 9, further comprising the steps of:
   sampling a local block select signal using said second control pulse to generate a third control pulse that is propagated in said decode path to a wordline driver circuit of the selected memory block; and
   sampling a wordline select signal input to a wordline driver using said third control pulse to generate said wordline enable pulse.

11. The method of claim 10, further comprising the steps of:
   sampling a static write enable signal using said second control pulse to generate a write pulse, wherein said write pulse is synchronized with said third control pulse; and
   inputting said synchronized third control pulse and write pulse to a write transmission gate driver to generate said write enable pulse.

12. The method of claim 10, further comprising the steps of:
   sampling a static read enable signal using said second control pulse to generate a read pulse, wherein said read pulse is synchronized with said third control pulse; and
   inputting said synchronized third control pulse and read pulse to a local sense amplifier driver to generate said sense amplifier enable pulse.

13. The method of claim 12, further comprising the step of using said sense amplifier enable pulse to generate a global sense amplifier enable pulse that is synchronized to said sense amplifier enable pulse.

14. The method of claim 1, wherein the method is implemented in a SRAM (static random access memory).

15. The method of claim 1, wherein the method is implemented for performing data access operations in a cache memory.

16. The method of claim 1, wherein said cache memory comprises an instruction cache or a data cache.

17. A method for controlling data access operations in a SRAM (static random access) device comprising a hierarchical memory array, wherein the memory array is divided into a plurality of memory blocks, wherein each memory block is divided into a plurality of global columns, and wherein each global column is divided into a plurality of local blocks, the method comprising the steps of:
   inputting an address signal to a decode network of a memory block of the memory array;
   sampling a least significant bit of the address signal to generate a control pulse;
   propagating said control pulse along a decode path from said input of said least significant bit to a global column decoder in said decode network;
   inputting a global column select signal to said global column decoder for selecting a global column corresponding to said global column decoder, and sampling said input global column select signal using said first control pulse to output a second control pulse from said global column decoder; and
   propagating said second control pulse along a decode path of said selected global column to synchronize sequential activation of control circuitry of said selected global column for enabling a data access operation in a selected local block of said selected global column.

18. The method of claim 17, wherein the step of sampling a least significant bit of the address signal comprises generating an initial pulse using a system clock signal in response to an active command for the data access operation, wherein said initial pulse is used to sample said least significant bit.

19. The method of claim 17, further comprising the step of using said second control pulse to either (i) generate a wordline enable pulse that is synchronized to a write enable pulse to perform a write operation in said local block, or to (ii) generate a wordline enable pulse that is synchronized to a sense amplifier enable pulse to perform a read operation in said local block.

20. The method of claim 19, further comprising the steps of:
   sampling a local block select signal using said second control pulse to generate a third control pulse that is propagated in said decode path of said selected column block to a wordline driver circuit of said selected local block; and
   sampling a wordline select signal input to a wordline driver using said third control pulse to generate said wordline enable pulse.

21. The method of claim 20, further comprising the steps of:

sampling a static write enable signal using said second control pulse to generate a write pulse, wherein said write pulse is synchronized with said third control pulse; and inputting said synchronized third control pulse and write pulse to a write transmission gate driver to generate said write enable pulse.

22. The method of claim 20, further comprising the steps of:

sampling a static read enable signal using said second control pulse to generate a read pulse, wherein said read pulse is synchronized with said third control pulse; and inputting said synchronized third control pulse and read pulse to a local sense amplifier driver to generate said sense amplifier enable pulse.

23. The method of claim 22, further comprising the step of using said sense amplifier enable pulse to generate a global sense amplifier enable pulse that is synchronized to said sense amplifier enable pulse.

24. A semiconductor device, comprising:

a memory array that is logically divided into a plurality of memory blocks;

a decode network for receiving an address signal and decoding the address signal to select a memory block in the memory array to perform a data access operation; and a pulse generator for generating a control pulse that propagates along a decode path of said decode network to synchronize sequential activation of control circuitry in said decode path for enabling said data access operation in said selected memory block.

25. The device of claim 24, wherein the memory array is SRAM (static random access memory).

26. The device of claim 24, wherein the memory array comprises a cache memory.

27. The device of claim 26, wherein the cache memory comprises an instruction cache or a data cache.

28. The device of claim 24, wherein the pulse generator is responsive to a clock signal and data access command to generate the control pulse.

29. The device of claim 24, wherein said control pulse propagates along a single decode path from a single address bit input buffer, to a selected wordline of said selected memory block.

30. The device of claim 24, wherein said decode network comprises control circuitry for sequentially generating one or more psuedo-control pulses to synchronize switching functions in said decode path.

31. The device of claim 30, wherein said control circuitry comprises a circuit for sampling a least significant bit of said address signal using said control pulse to generate a first control pulse.

32. The device of claim 31, wherein said control circuitry further comprises a circuit for sampling a global column/row select signal using said first control pulse to generate a second control pulse that is propagated to a global column/row decoding network of said decode network.

33. The device of claim 32, wherein said global column/row decoding network comprises control circuitry responsive to said second control pulse to (i) generate a wordline enable pulse that is synchronized to a write enable pulse for performing a write operation, and to (ii) generate a wordline enable pulse that is synchronized to a sense amplifier enable pulse for performing a read operation.

34. The device of claim 33, wherein said control circuitry further comprises:

a local block select circuit, which receives as input said second control pulse and a local block select signal to generate a third control pulse, wherein the local block select signal specifies a selected memory block; and a wordline driver circuit, which receives as input said third control pulse and a wordline select signal to generate said wordline enable pulse for activating a wordline associated with said selected memory block.

35. The device of claim 33, wherein said control circuitry further comprises:

a write pulse stretcher for sampling a static write enable signal using said second control pulse to generate a write pulse that is wider than said second control pulse, wherein said write pulse is synchronized with said third control pulse; and a write transmission gate driver that generates said write enable pulse in response to said synchronized third control pulse and write pulse.

36. The device of claim 33, wherein said control circuitry further comprises:

a read pulse stretcher for sampling a static read enable signal using said second control pulse to generate a read pulse that is wider than said second control pulse, wherein said read pulse is synchronized with said third control pulse; and a local sense amplifier driver that generates said sense amplifier enable pulse in response to said synchronized third control pulse and read pulse.

* * * * *